United States Patent [19]

Howard

[11] 4,428,659

[45] Jan. 31, 1984

[54] APPARATUS AND METHOD FOR REMOVING SOLUBLE PORTIONS OF A COATING

[75] Inventor: Lawrence E. Howard, Escondido, Calif.

[73] Assignee: Napp Systems (USA), Inc., San Marcos, Calif.

[21] Appl. No.: 269,561

[22] Filed: Jun. 2, 1981

[51] Int. Cl.³ .............................................. G03D 3/12
[52] U.S. Cl. .................................... 354/317; 354/320; 354/325; 15/77; 118/304; 118/427; 430/309
[58] Field of Search ............... 354/297, 317, 320, 322, 354/325; 15/77, 102; 355/100; 118/304, 424, 427, 109, 120, 326; 430/309, 331, 306

[56] References Cited

U.S. PATENT DOCUMENTS

| 2,592,693 | 4/1952 | Hayms. | |
|---|---|---|---|
| 2,677,320 | 5/1954 | Coughlin | 354/317 |
| 3,461,787 | 8/1969 | Pfaff | 354/317 |
| 3,589,261 | 6/1971 | Krikelis | 354/322 |
| 3,846,816 | 11/1974 | Gaisser | 354/317 |
| 3,906,895 | 9/1975 | Morino et al. | 118/326 |
| 3,936,853 | 2/1976 | Mart | 354/317 |
| 3,981,583 | 9/1976 | Tsuchida et al. | 354/325 |
| 4,068,251 | 1/1978 | Schroter et al. | 354/325 |
| 4,145,135 | 3/1979 | Sara | 354/317 |
| 4,178,097 | 12/1979 | Sara | 355/100 |
| 4,268,612 | 5/1981 | Misek | 430/306 |
| 4,349,932 | 9/1982 | Schornig | 15/102 |

*Primary Examiner*—A. A. Mathews
*Attorney, Agent, or Firm*—Hosier, Niro & Daleiden

[57] ABSTRACT

An apparatus and method in which a coating is wetted with a solvent to initiate dissolution of soluble coating portions and the hydraulic pressure of the solvent at the surface of the coating is repeatedly increased and decreased to assist in the dissolution of the soluble coating portions. A brush with an array of bristles reciprocating in a path perpendicular to the coating may be utilized to produce the increasing and decreasing hydraulic pressure. Also, the coating may be immersed in the solvent to wet it and to initiate dissolution of the soluble coating portions.

37 Claims, 9 Drawing Figures

FIG. 2
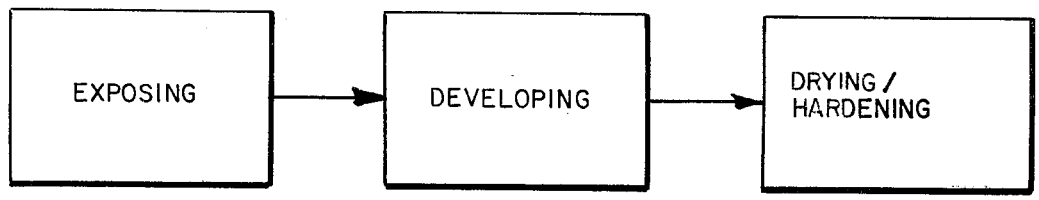
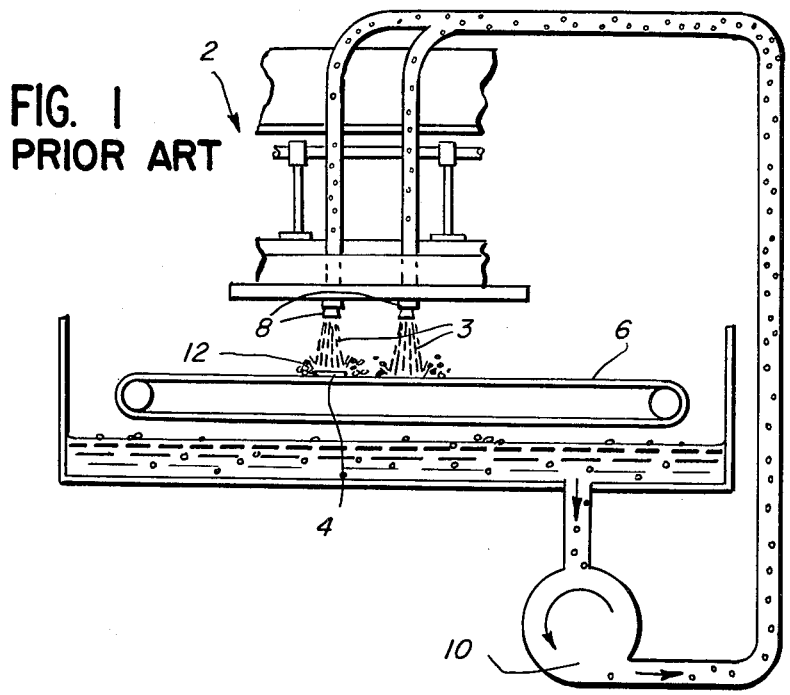
FIG. 1 PRIOR ART
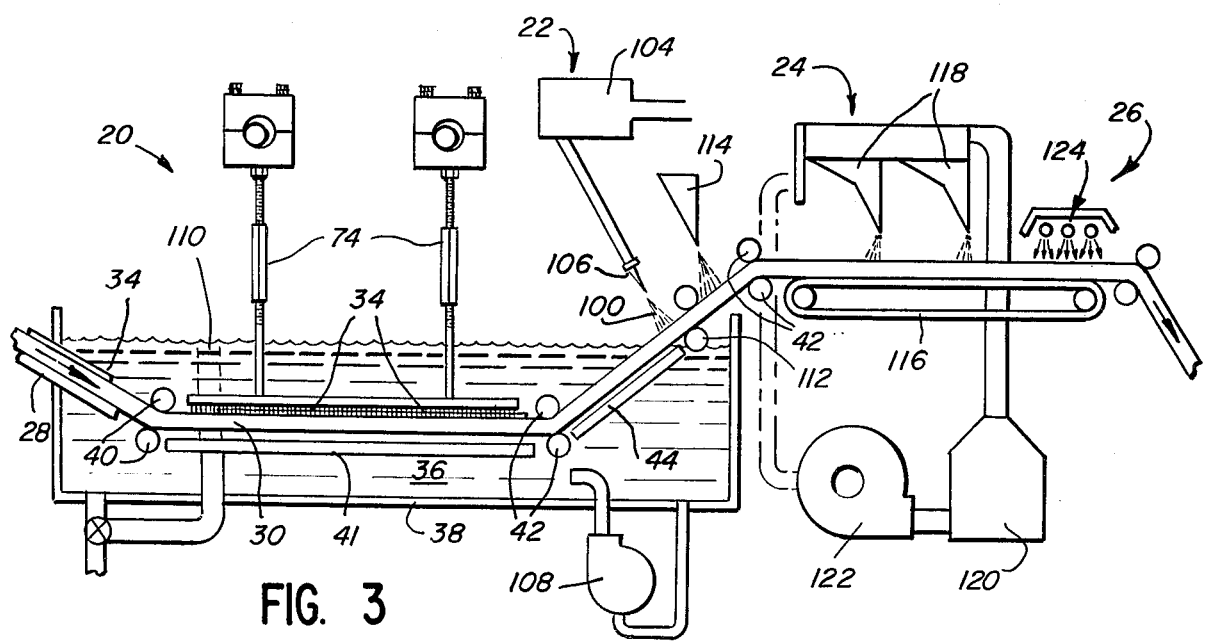
FIG. 3

APPARATUS AND METHOD FOR REMOVING SOLUBLE PORTIONS OF A COATING

BACKGROUND OF THE INVENTION

This invention relates generally to an apparatus and a method for removing soluble portions of a coating to produce a high resolution image in the coating. More particularly, this invention relates to an apparatus and a method in which reciprocatory point pressure is applied to the surface of a coating to aid in the dissolution and physical removal of soluble portions of the coating. In one particularly important embodiment of this invention, an apparatus and a method are described for developing high resolution relief images on photopolymer coated plates for letter-press printing applications.

The following description of the invention, including the prior art and the preferred embodiments, has been confined to the development of photosensitive graphic arts articles, particularly photopolymer printing plates. The description has been so limited, however, only to facilitate an understanding of the inventon, and is not intended to limit the range of application or protection accorded the invention. Indeed, it will be clear to those skilled in the art from the discussion of the invention in the context of photopolymer printing plates that it will have wide utility in a broad range of applications where portions of coatings are to be removed from a substrate.

Modern letter-press printing now commonly utilizes printing plates having photographically produced relief images. These printing plates include a laminated structure consisting of a thin coating of a photosensitive composition bonded to a metal or plastic substrate. The desired relief image is obtained by exposing the plate through a photographic negative to create a differential in solubility in the photosensitive composition thereby producing a latent image corresponding to the desired relief image.

This latent image is developed into a relief image by dissolving and physically removing the portions of the photosensitive composition which are soluble in a properly chosen developer solution. One particularly suitable photosensitive material is the photopolymer described in U.S. Pat. No. 3,801,328 to Takamoto et al. This photopolymer may be developed with water.

Although numerous developing solutions are available for the various photopolymers described in the art, the range of known commercially practical techniques available for physically removing soluble photopolymer is limited to two: (1) mechanically abrading or rubbing the photopolymer coating with a developer solution laden sponge, cloth or brush; and (2) subjecting the photopolymer coating to a high pressure stream of developer solution. Each of these approaches to developing the photopolymer printing plate has serious drawbacks which are obviated by the present invention.

Conventional rubbing techniques for developing photopolymer plates entail vigorously rubbing a sponge, cloth, brush or other mildly abrasive article across the surface of the plate, typically in a circular motion, to accelerate dissolution and physical removal of the soluble photopolymer. Unfortunately, even with vigorous rubbing action, it may not be possible to clear the solubilized polymer out of the many recesses and crevices of the relief image. Indeed, this technique often not only fails to clear these areas, but also tends to carry earlier removed photopolymer particles back into highlight areas, and to abrade delicate insoluble portions of the image. As a result, letter-press prints produced from plates developed in this way lack the consistent high resolution qualities demanded in the marketplace.

Spray development techniques were devised to overcome some of the inherent drawbacks of the rubbing development techniques by both accelerating the development process and improving image resolution. In spray development, typically carried out in an apparatus 2 like that illustrated in FIG. 1, the developing solution 3 is directed against the surface of a printing plate 4 moving along conveyor belt 6 through high pressure nozzles 8 which typically reciprocate in a plane back and forth across the surface of the plate. The high pressure spray drives the developing solution into the photopolymer to help dissolve the solubilized portions of the latent image and to physically remove these portions from the printing plate.

Although certainly an improvement over rubbing development, spray development techniques have a number of their own unique problems. For example, the high pressure spray may damage delicate highlight portions of the insoluble image and soften portions of the image, complicating later drying steps. Also, the high pressure sprays produce a fine mist which contaminates the air surrounding the nozzles and results in loss of the developing solution. In addition, large quantities of developing solution must be stored in bulky reservoirs ready to be drawn through high pressure pumps (indicated at 10 in FIG. 1) for injection through the spray nozzles. A very significant problem inherent in the spray development approach is air entrainment or foaming 12 which occurs at the plate surface as the spray impacts against it. This foaming problem is aggravated by the photopolymer carried by the developer solution which encourages further air entrainment. If this foam is permitted to reach the high pressure pumps, uneven spraying and damage to the pumps due to cavitation will result.

In order to minimize foaming problems, it is necessary to maintain the lowest practicable level of photopolymer solids in the developer reservoir and to introduce defoaming agents. These defoamers are not only an unwelcome significant additional expense, they may interfere with the operation of the developer solution in dissolving the photopolymer.

SUMMARY OF THE INVENTION

It is therefore an object of the present invention to provide a new and improved method and apparatus for removing soluble portions of a coating to produce a high resolution image.

It is a further object of the present invention to provide an apparatus and method for developing photosensitive graphic arts articles without either transverse rubbing of the surface of the articles or subjecting them to high pressure developer spray.

Yet another important object of the present invention is to eliminate the need for defoaming agents required by the prior high pressure spray development process.

In yet another important embodiment of the present invention, a high pressure stream of rinse liquid is directed onto the coating after the active development stage fron nozzles positioned above the development bath. Since the rinse liquid flows into the bath, by carefully controlling the temperature and volume of the rinse liquid, the temperature and solids level of the bath may very readily be maintained within a predetermined range.

Other objects and features of the invention will become apparent upon examination of the following specification, drawings and claims.

Soluble portions of the coating may be removed according to the practice of the present invention in an active development process entailing wetting the coating with a solvent to initiate dissolution and repeatedly applying point pressure to the surface of the coating by a reciprocating applicator which travels perpendicular to the coating surface. This point pressure may be applied with a brush having an array of bristles which reciprocate in a generally perpendicular path with the bristle tips repeatedly impacting against the coating. The reciprocating bristles assist in the dissolution and removal of soluble portions of the photopolymer directly by impinging upon and at least partially penetrating the photopolymer and indirectly by agitating the developing solution in the area of the moving bristle tips adjacent the coating.

In one important embodiment of the present invention, the reciprocatory point pressure is applied to the coating while it is immersed in the developing solution to improve the development eiffciency and minimize foaming. In a further refinement, the entire brush is also immersed thereby almost completely eliminating air entrainment and foaming in the developing bath. In these latter arrangments, the hydraulic pressure of the developer solution is repeatedly increased and decreased causing it to flow in and out of the path of the bristles thereby enhancing the very desirable agitation of the developer at the surface of the coating.

The present invention therefore brings to the art a new, highly efficient apparatus and method for removing soluble portions of a coating to produce a high resolution image. This new apparatus and method eliminates the resolution problems inherent in systems utilizing rubbing development techniques and eliminates foaming and other problems inherent in the use of the more modern high pressure spray development techniques.

BRIEF DESCRIPTION OF THE DRAWINGS

The features of this invention which are believed to be novel are set forth with particularity in the appended claims. The invention, together with its objects and advantages, may be best understood by reference to the following description taken in conjunction with the accompanying drawings, in which like reference numerals identify like elements in the several figures and in which:

FIG. 1 is a partial elevational view of a spray development apparatus of the prior art;

FIG. 2 is a flow diagram portraying the basic steps in the production of a letter-press printing plate;

FIG. 3 is a diagrammatic representation of an apparatus according to the teaching of the present invention including a development unit, a rinsing unit, a drying unit and a post-curing unit;

DESCRIPTION OF THE PREFERRED EMBODIMENTS

Figure 4:
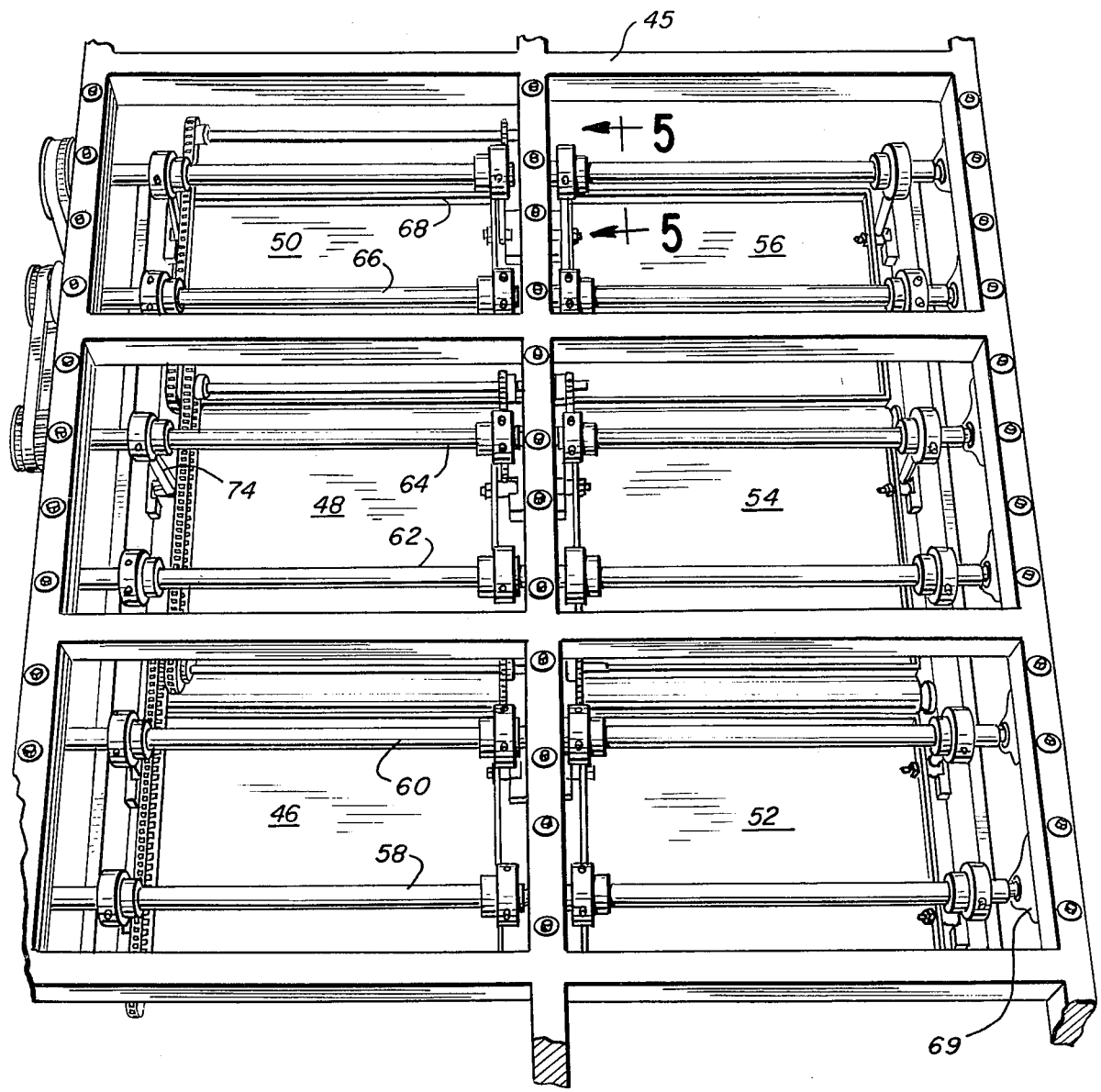
FIG. 4 is a top view of an apparatus according to the teaching of FIG. 3 illustrating an array of brush plates mounted for reciprocatory motion.

The prior art developing apparatus and method illustrated in FIG. 1 is typically employed in a process for the production of photopolymer printing plates illustrated in the block diagram of FIG. 2; this is a three-step process including exposing, developing and drying/hardening. These steps are common to the production of most photosensitive graphic arts articles, including not only letter-prese printing plates but also lithographic films and plates, offset plates, and contact films and papers.

The present invention is concerned with the wet end of the production process, which includes the washing and the drying/hardening steps. Therefore, in the following description of the preferred embodiments of the invention it will be assumed that exposure of the graphic arts article has been properly effected prior to the initiation of the development process.

Turning now to FIG. 3, the apparatus of the present invention may be seen to include a developing unit 20, a rinsing unit 22, a drying unit 24 and a hardening or post cure unit 26.

Development unit 20 includes an inclined feed tray 28 leading to feedroll transport 30 which is arranged to carry exposed printing plates 34 from the feed tray and through the bath of developing solution 36 in developing tank 38. The feedroll transport, which is driven by a motor and pulley (not shown) associated with rollers 40 and 42, moves past roller 40 across a horizontal backing plate 41, past roller 42, up exit ramp 44 and out of the developing bath.

Repeated point pressure is applied to printing plates 34 moving along the horizontal portion of the transport path in a manner which will be described in some detail below in connection with FIGS. 4, 5, 6 and 7a—7c.

Turning first to FIG. 4, a frame 45 is shown supporting an array of six brushes 46–56 which are linked to a series of six drive shafts 58–68 through eccentric cam arrangements. Shafts 58–68 are supported at their ends and midpoints in bearing blocks 69. The shafts are rotated by a motor driven pulley system along the drive side 71 of the frame, which consists of a series of chain driven auxiliary shafts and take-off pulleys attached to each drive shaft.

Figure 5:
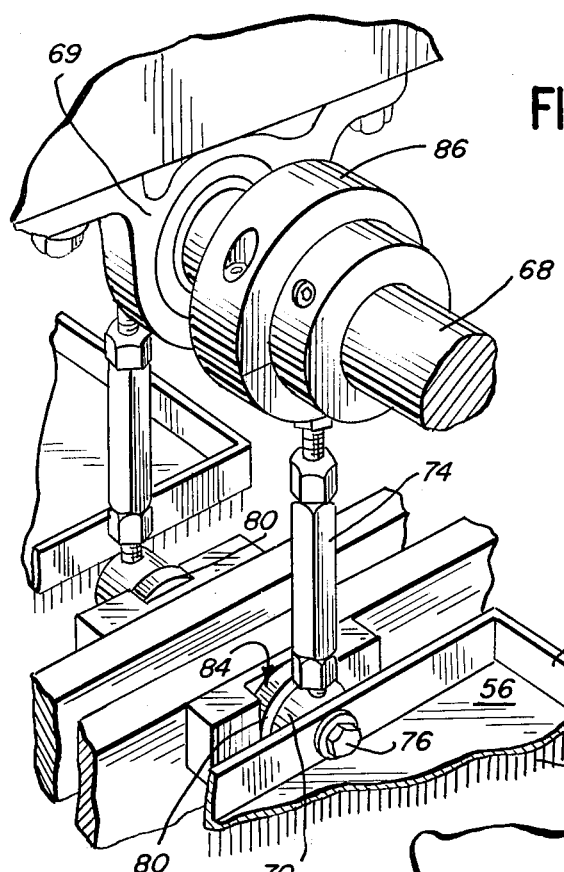
FIG. 5 is an exploded perspective view of a cam drive for a brush plate taken along sight line 5—5 of FIG. 4.

Brushes 46–56 are rectangular plates with upstanding sides 70 and generally parallel, downwardly directed bristles 72, as shown in FIG. 5. The brushes are supported near each of their four corners by adjustable rigid linkages 74. These linkages each are rotatably attached to the brush sides by a bolt 76 disposed in a hole in the brush side and a bushing 78 affixed to the lower end of each linkage 74. The end of each bolt 76 has a circular cap 80 which is dimensioned for a slip fit within a vertical track 84 of a guide block 82.

The upper end of each adjustable linkage is rigidly attached to a bushing 86 which rides in an eccentrically undercut portion of its corresponding drive shaft. The shafts are eccentrically undercut to produce a predetermined range of vertical motion in the bushings. Of course, a regular shaft and eccentric bushing arrangement could be used in lieu of the regular bushing/eccentric shaft combination.

The bushings 86 are made of phenolic resin and the drive shafts are made of stainless steel. The bushing-to-shaft interface is continuously irrigated with water to minimize friction. The combination of phenolic resin and stainless steel has been found to offer good operating characteristics and to avoid corrosion problems which could arise with other materials due to the aqueous environment of the proximate developing bath. Other combinations of materials could, of course, be used.

The cycle of movement of each brush is phased to minimize vibration in frame 45. Thus, when brush 46 is at an arbitrary 0° phase, brush 48 is at 120°, brush 50 is at 240°, brush 52 is at 180°, brush 54 is at 300° and brush 56 is at 60°.

The choice of brush bristle, the rate of reciprocatory motion of the brush, the spacing of the brush bristles from the surface to be developed and the amplitude of motion of the brushes are interrelated variables of the present invention which must be chosen based upon the nature of the coating being treated, the rate at which the coating is moving past the brushes and the nature of the developing solution. However, in order to better explain the present invention and to illustrate the interrelationship of these many variables, a specific application of the present invention to the active development of a letter-press printing plate is described below.

EXAMPLE

Photopolymer Printing Plate

The plates utilized in this example were prepared in accordance with the teaching of U.S. Pat. No. 3,801,328 referred to eariler. These plates have a water-developable photopolymer coating of about 0.020 inches on an aluminum substrate.

Brush Parameters

The brush bristles used in the example were of ANTRON type nylon available from Collins and Aikman under the name "BRUSH-UP". However, it should be stressed that the brush bristles may be chosen from a wide variety of available materials, including polyester, nylon, polypropylene and others.

Since the diameter of the brush bristle has been found to affect the resolution of the resulting relief image of the printing plate, a small diameter bristle which can meet stiffness and longevity requirements is preferred. In this example, dot resolution down to about 2 mils was sought and achieved with a brush bristle diameter of 0.0025 to 0.0030 inches.

The trim length of the bristles used in this example, (T in FIG. 6) ranged from 0.187 to 0.230 inches. The preferred trim length for these bristles was found to lie in the narrower range of 0.160–0.230 inches.

The bristle density in the brushes ranged from about 7 to 11 percent in terms of the total area occupied by the bristles at their point of attachment to the brush. However bristle densities in a range from 2 to 20 percent or greater are expected to produce at least as good a result as was obtained in this example. Also, it was found that as the development proceeded, the bristle tips began to split to produce a multitude of fine bristles which tended to enhance the development process.

Amplitude of Brush Movement

Figure 6:
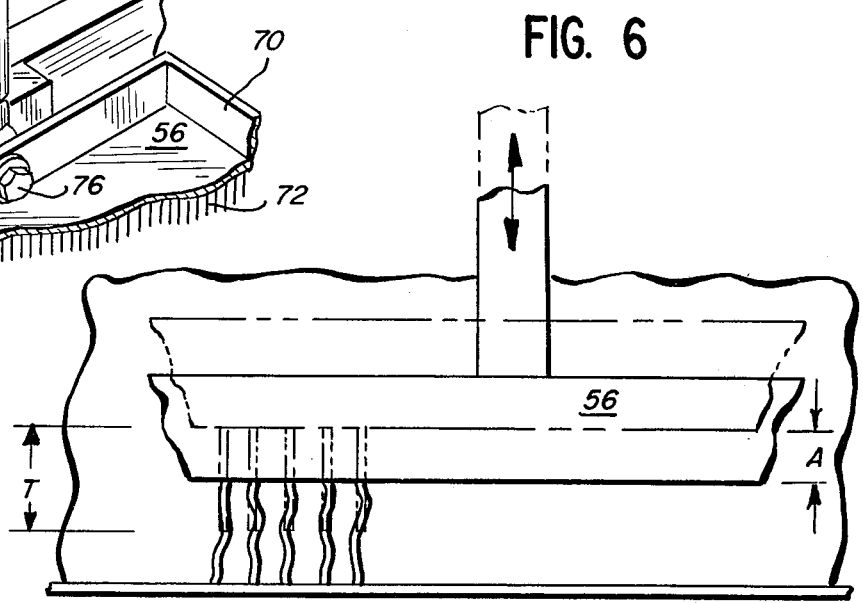
FIG. 6 is an enlarged partial view of a brush plate showing the range of motion of the brush plate.

The length of the vertical path within which the brushes move is referred to as the brush amplitude, which is indicated by the letter A in FIG. 6. In the present example, the preferred brush amplitude fell in the range of from 0.040 to 0.240 inches. It was found, however, to be more preferable to confine the amplitude to under 0.100 inches. At amplitudes above 0.100 inches, bath agitation produced by the moving brush tended to produce splashing at the surface of the bath. Amplitudes under 0.040 inches, on the other hand, required stiffer bristles, which would adversely affect bristle life.

Bristle Incursion

Figure 7A:
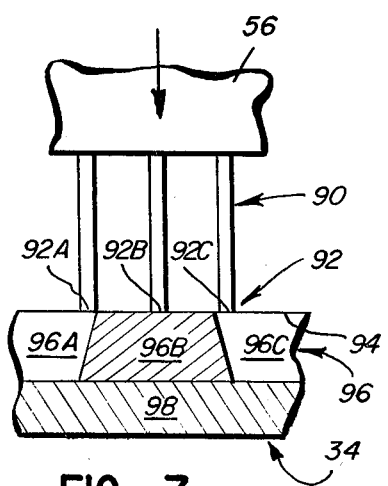
FIG. 7a—7c partial diagrammatic views of a brush plate as it moves against the surface of an exposed photopolymer printing plate as the brush plate travels through the downward stroke of its reciprocating path.
Figure 7B:
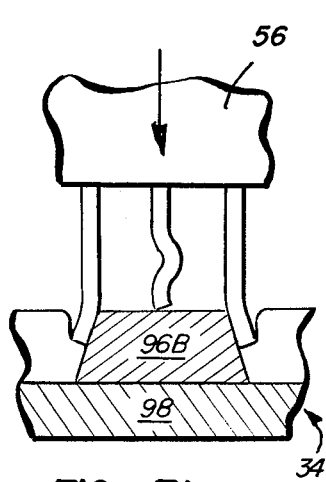
Figure 7C:
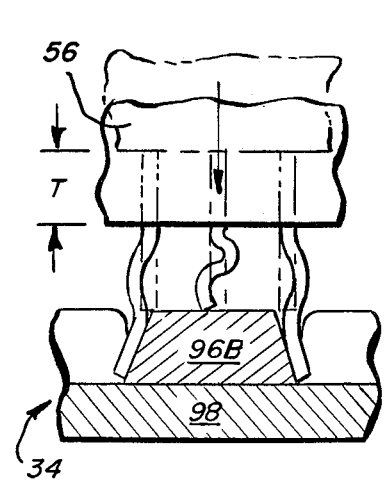

Turning to FIGS. 7a–7c, bristle incursion (labelled I in FIG. 7c) is the theoretical distance which the brush bristle tips 92 would travel from the point at which they contact the surface 94 of the plate coating 96 to the point at which the brush reaches the bottom of its downward stroke if the plate 34 were not present.

FIGS. 7a–7c serve not only to define the term "bristle incursion," but also to illustrate the manner in which the point pressure of the brush bristles physically removes soluble polymer. Beginning with FIG. 7a, bristles 90 are shown at the point at which the bristle tips 92 first contact surface 94 of the coating 96. As the brush continues downward in the brush stroke, bristle tips 92A and 92C encounter and penetrate softened soluble polymer portions 96A and 96C. Bristle tip 92B, on the other hand, encounters a hardened insoluble portion of the image 96B which it cannot penetrate. As the brush bristles continue through the intermediate position of FIG. 7b to the bottom of the brush stroke in FIG. 7c, bristle tips 92A and 92C eventually penetrate through to the substrate 98, whereas bristle tip 92B bends out of the way. On the return stroke of the brush (not shown), bristles 90A and 90C carry away polymer loosened as all of the bristles return to their initial straightened configuration.

Bristle incursion and stiffness (the latter a function of bristle material and dimensions) are chosen to obtain the optimal development action or aggression without damaging the hardened portions of the coating image, represented by 94B in FIGS. 7a–7c. For the bristles of the present example, the incursion should be in the broad range of 0.050 to 0.080 inches and preferably in the range of 0.055 to 0.075 inches.

In an alternate embodiment, brushes of varying aggression could be used to impact upon the plate in steps as it progresses through the development bath. "Aggression" as used herein is intended to refer to the physical properties of the brush bristles which are determined by choice of bristle material, thickness and length. For example, brushes 46 and 52 could have short, coarse bristles which would rapidly remove 30–50 percent of the soluble polymer without damaging delicate highlight areas. Brushes 48 and 54 would, in turn, have longer and finer bristles to more gently work over the image, exposing the flanks of the image highlights. Brushes 50 and 56 could then have the longest, finest bristles to gently remove the small amounts of remaining material without harming delicate portions of the image.

Frequency of Reciprocatory Motion

The rate of reciprocatory motion of the brushes may vary within the broad range of up to about 7200 cycles per minute. However, physical limitations in the mechanical systems for producing the reciprocatory motion may require rates well below 7200 cycles per minute. For example, in the eccentric cam system described earlier and employed in this example, a reciprocatory rate of about 1200 cycles per minute was found to be satisfactory and practically obtainable.

Although a mechanical, eccentric drive system is described herein, other drive systems could be utilized, such as electromagnetic vibrator drives, hydraulic drives, pneumatic drives and others.

It should be also noted in connection with the frequency of reciprocatory motion that the brushes and their supporting plates were completely submerged in the developing solution during the entire range of their vertical path of movement. This enables the rapidly moving brushes to increase and decrease hydraulic pressure and create substantial developer flow velocity in the vicinity of the plate surfaces to accelerate polymer dissolution and to carry away loosened polymer particles. Furthermore, foaming is not produced by the rapidly moving brushes because they are completely submerged within the development bath and air is therefor not entrained in the developer.

Development Parameters

In this example, the plates were of equal length and width of approximately 24 inches and were moved by the conveyor with three inch gaps between each plate at a rate of 27 inches per minute. This corresponds to a processing rate of 120 plates per hour.

The development tank used contained 80 gallons of developing solution (water) at a depth of about 5.25 inches. The tank was configured to permit each plate to move through the developing solution in a period of 1.75 minutes.

The temperature of the developing solution was maintained in the range of 80° to 120° F., with the preferred range being about 100° to 110° F. If the temperature of the developer had dropped below 80° F., the solubility of the polymer would have been adversely affected. If the developing bath temperature had risen above 130° F., the photopolymer would have begun to absorb excess water, impairing resolution of the relief image and making the plate difficult to dry. Also, outside of the broad 80-130° F. range, the differential in solubility between exposed and unexposed polymer would be expected to decrease making development more difficult.

The plates produced according to the teaching of the example had extremely good resolution and hardness. However, since the example is limited to the active development process, we turn now to the next stage of treatment which is performed in rinsing unit 22.

As printing plates 34 are conveyed past the last brushes, they are carried along upwardly slanted exit ramp 44 to a high pressure stream of rinse liquid 100 which is warmed in heater 104 and emerges from spray nozzles 106. The rinse liquid is pure developer (i.e., water) rather than polymer-laden as in some prior rinse systems, preventing significant foaming problems in the rinsing unit. The high pressure stream flushes the surface of the relief image to clear out polymer-laden developer which could otherwise harden on the image during drying and post cure, impairing resolution. In one preferred embodiment, the rinse water is pumped at a total rate of 1.5 gallons per minute through a bank of twelve Spraying Systems, Inc. 1/44TT 6501 fan spray nozzles arranged on three inch centers.

Since the nozzles are positioned above the bath at the upper end of the exist ramp, the rinse water flows down into the developing bath replacing spent developer and maintaining the polymer solids level of the developing bath at an acceptable level. In addition, the rinse water temperature is maintained by heater 104 at a level which will keep the temperature of the developing bath within the desired predetermined temperature range. A recirculating pump 108 continuously circulates the developer within the developing bath to maintain a relatively uniform temperature level. An overflow pipe 110 permits polymer-laden developer displaced by the entering rinse water to be drained from the bath to maintain the desired developer level 112. This approach to maintaining the temperature and solids level of the developing bath within a predetermined range obviates problems experienced with prior art systems. The approach of the prior art has been to directly heat the polymer-laden developing bath, which caused polymer to plate out in the heater and, where spray systems were utilized, to foul the spray nozzles.

Rinsing unit 22 includes a nip-roll squeegee 112 which squeegees excess rinse water off the plates before they move under a compressed air knife 114 positioned just above the conveyor. The high pressure air blast provided by the air knife supplements the action of the rinse bar by further clearing liquid from the recesses of the relief image profile in the finished plate. In a preferred embodiment, two banks of nine Spraying System, Inc. $\frac{1}{4}$TTL nozzles are used to generate two narrow fan shaped air streams.

Drying unit 24 comprises a stainless mesh conveyor belt 116 which carries the partially dried plate past high efficiency, high velocity air knives 118 which direct air heated in heating unit 120 and driven by high velocity blower 122 against the surface of the plates. As the plates leave the drying unit, they are dried and ready for postcure hardening under cold UV light provided by a bank of UV lamps 124 at hardening unit 26. The plates which leave hardening unit 26 are ready for use in high resolution letter press printing.

While particular embodiments of the invention have been shown and described, it will be obvious to those skilled in the art that changes and modifications may be made therein without departing from the invention in its broader aspects. It is therefore the object of the appended claims to cover all such changes and modifications which fall within the true spirit and scope of the invention.

What is claimed is:

1. In a process for developing a graphic arts article in which the article is exposed, developed, dried, and hardened, the improvement comprising:

immersing said article in a developing solution while repeatedly applying point pressure thereto in a direction generally perpendicular to the coating surface to assist in the removal of soluble portions of said coating.

2. An apparatus for developing a photosensitive graphic arts article wherein a latent image is converted to a relief image by removing soluble portions of the photosensitive coating of the article, said apparatus comprising:

means for immersing said graphic arts article in a bath containing a solvent; and means for mechanically engaging said coating while immersed in said solvent to assist in the removal of said soluble portions, said engaging means reciprocating in a path generally perpendicular to the surface of said coating to repeatedly contact said coating thereby assisting in the removal of soluble portions of said photosensitive coating.

3. The development apparatus of claim 2 wherein said engaging means comprises a brush having an array of bristles, said bristles repeatedly contacting said coating as said brush reciprocates through said pathway.

4. The development apparatus of claim 2 wherein said engaging means comprises a plurality of brushes of varying aggression successively impacting upon said coating.

5. The development apparatus of claim 2 wherein said graphic arts article is in the form of a generally planar sheet, and said apparatus includes means for conveying said sheet through said bath along a path generally transverse to the reciprocating path of said engaging means.

6. The development apparatus of claim 5 further including means for drying said graphic arts article after development, said conveying means carrying said graphic arts article out of said bath and into said drying means.

7. The development apparatus of claim 2 further including means for rinsing said graphic arts article after development, said rinsing means including at least one nozzle for directing a stream of rinse liquid onto said graphic arts article.

8. The development apparatus of claim 7 wherein said rinsing means is positioned above said bath so that said rinse liquid will flow into said bath after rinsing said graphic arts article.

9. The development apparatus of claim 27 wherein said bath is maintained within a predetermined temperature range by controlling the temperature of said rinse liquid.

10. The development apparatus of claim 3 wherein said bristles remain immersed in said bath as said brush travels through said reciprocating path.

11. The development apparatus of claim 6 further including means for removing free liquid on the surface of said graphic arts article prior to conveying said article to said drying means.

12. The development apparatus of claim 11 wherein said removal means comprises a squeegee roller.

13. The development apparatus of claim 11 wherein said removal means comprises an air knife.

14. The development apparatus of claim 6 further including means for subjecting said graphic arts article to cold, UV light after treatment by said drying means.

15. A method for developing an exposed letterpress printing plate having a water-developable photopolymer coating wherein a relief image is produced by removing soluble portions of the photopolymer coating comprising:
conveying said plate through a developer bath;
subjecting said photopolymer coating to point pressure from a plurality of brush bristles as said plate moves through said bath, said bristles reciprocating in a path generally perpendicular to the surface of said coating;
conveying said plate out of said bath; and
subjecting said plate to a stream of developer to rinse said relief image.

16. An apparatus for removing soluble portions of a coating to leave a high resolution comprising:
means for wetting the coating with a solvent to initiate dissolution of the soluble portions;
means reciprocating relative to the coating and traveling through a path generally perpendicular to the surface of the coating to assist in the dissolution and removal of the soluble portions; said reciprocating means including means for repeatedly increasing and decreasing the hydraulic pressure of said solvent at the surface of the coating; and
wherein the coating is immersed in said solvent while said reciprocating means acts on the soluble portions thereof.

17. An apparatus for removing soluble portions of a coating to leave a high resolution image comprising:
means for wetting the coating with a solvent to initiate dissolution of the soluble portions;
means reciprocating relative to the coating and traveling through a path generally perpendicular to the surface of the coating to assist in the dissolution and removal of the soluble portions; said reciprocating means including means for repeatedly increasing and decreasing the hydraulic pressure of said solvent at the surface of the coating; and
wherein said reciprocating means is driven by an electromagnetic vibrator.

18. An apparatus for removing soluble portions of a coating to leave a high resolution image comprising:
means for wetting the coating with a solvent to initiate dissolution of the soluble portions;
means reciprocating relative to the coating and traveling through a path generally perpendicular to the surface of the coating to assist in the dissolution and removal of the soluble portions; said reciprocating means including means for repeatedly increasing and decreasing the hydraulic pressure of said solvent at the surface of the coating; and
said reciprocating means acts to assist in the dissolution and removal of the soluble portions without substantial transverse mechanical development action on the coating.

19. The apparatus as set forth in claim 18 wherein said reciprocating means acts across the surface of said coating and includes means for applying point pressure at a plurality of locations thereon.

20. The apparatus as set forth in claim 18 wherein said reciprocating means at least partially penetrates the soluble portions of said coating to assist in dissolution and removal thereof.

21. The apparatus as set forth in claim 18 wherein said reciprocating means is driven by an eccentric cam.

22. The apparatus as set forth in claim 18 wherein said reciprocating means includes a brush with an array of bristles for contacting the surface of the coating.

23. The apparatus as set forth in claim 22 wherein:
said coating comprises a photosensitive polymer of about 0.020 inches in thickness;
said bristles are about 0.003 inches or less in diameter and about 0.0187 to 0.230 inches in length; and
said brush is arranged to reciprocate with an amplitude of from about 0.040 to 0.240 inches with an incursion of from about 0.050 to 0.080 inches.

24. The apparatus as set forth in claim 22 wherein:
said bristles are about 0.160 to 0.220 inches in length; and
said amplitude ranges from about 0.040 to 0.100 inches and said incursion ranges from about 0.055 to 0.075 inches.

25. The apparatus as set forth in claim 18 which further includes means for advancing said coating laterally relative to the path of travel of said reciprocating means to sequentially remove all soluble portions of the coating.

26. A method for removing soluble portions of a coating to obtain a high resolution image, comprising the steps of:
- wetting the coating with a solvent to initiate dissolution of the soluble portions; and
- repeatedly increasing the decreasing the hydraulic pressure at the surface of the coating by the use of means which reciprocates relative to the coating without substantial transverse mechanical development action on the coating, to thereby assist in the dissolution and removal of the soluble portions.

27. An apparatus for removing soluble portions of a coating to leave a high resolution image comprising:
- means for immersing the coating in a solvent to wet the coating and to initiate dissolution of soluble portions; and
- means reciprocating relative to said coating and traveling through a path generally perpendicular to the surface of the coating to act on the coating and to assist in the dissolution and removal of said soluble portions while said coating is immersed.

28. The apparatus as set forth in claim 27 wherein said reciprocating means acts across the surface of said coating and includes means for applying point pressure at a plurality of locations thereon.

29. The apparatus as set forth in claim 27 wherein said reciprocating means includes means for repeatedly increasing and decreasing the hydraulic pressure of said solvent at the surface of said coating.

30. The apparatus as set forth in claim 27 wherein said reciprocating means at least partially penetrates the soluble portions of said coating to assist in dissolution and removal thereof.

31. The apparatus as set forth in claim 27 wherein said reciprocating means is driven by an eccentric cam.

32. The apparatus as set forth in claim 27 wherein said reciprocating means is driven by an electomagnetic vibrator.

33. The apparatus as set forth in claim 27 wherein said reciprocating means includes a brush with an array of bristles for contacting the surface of the coating.

34. The apparatus as set forth in claim 27 wherein:
- said coating comprises a photosensitive polymer up to about 0.020 inches in thickness;
- said bristles are about 0.003 inches or less in diameter and 0.230 inches or less in length; and
- said brush is arranged to reciprocate with an amplitude of 0.240 inches or less with an incursion of 0.080 inches or less.

35. The apparatus as set forth in claim 27 further including means for advancing said coating laterally relative to the path of travel of said reciprocating means to sequentially remove all soluble portions of the coating.

36. A method for removing soluble portions of a coating to leave a high resolution image comprising:
- immersing the coating in a solvent to wet the coating and to initiate dissolution of the soluble portions; and
- repeatedly applying point pressure to a plurality of locations across the surface of the coating, said point pressure being applied in a direction generally perpendicular to the surface of the coating.

37. The method for removing soluble portions of a coating according to claim 36 wherein the point pressure is applied at a rate of up to about 7200 cycles per minute.

* * * * *